United States Patent
Spica

(10) Patent No.: US 11,209,483 B2
(45) Date of Patent: Dec. 28, 2021

(54) CONTROLLER ACCESSIBLE TEST ACCESS PORT CONTROLS

(71) Applicant: Micron Technology, Inc., Boise, ID (US)

(72) Inventor: Michael Richard Spica, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/804,097

(22) Filed: Feb. 28, 2020

(65) Prior Publication Data

US 2021/0270894 A1   Sep. 2, 2021

(51) Int. Cl.
*G01R 31/28* (2006.01)
*G01R 31/3177* (2006.01)
*G01R 31/317* (2006.01)

(52) U.S. Cl.
CPC ... *G01R 31/3177* (2013.01); *G01R 31/31701* (2013.01); *G01R 31/31713* (2013.01)

(58) Field of Classification Search
None
See application file for complete search history.

(56) References Cited

U.S. PATENT DOCUMENTS

| | | | |
|---|---|---|---|
| 6,681,359 B1 * | 1/2004 | Au | G01R 31/318533 714/727 |
| 2002/0065646 A1 * | 5/2002 | Waldie | G06F 11/3648 703/26 |
| 2006/0242499 A1 * | 10/2006 | Volz | G01R 31/31907 714/724 |
| 2009/0006915 A1 * | 1/2009 | Gomez | G06F 11/2236 714/727 |
| 2012/0137186 A1 * | 5/2012 | Portolan | G01R 31/318558 714/727 |
| 2013/0124934 A1 * | 5/2013 | Jones | G01R 31/31908 714/727 |

* cited by examiner

*Primary Examiner* — Guerrier Merant
(74) *Attorney, Agent, or Firm* — Schwegman Lundberg & Woessner, P.A.

(57) ABSTRACT

Boundary scan test data and a command to initiate a boundary scan test are received via a universal asynchronous receiver-transmitter (UART). Based on receiving the command, a boundary scan test mode is initiated at a memory sub-system controller. A boundary scan test vector based on the boundary scan test data is synchronously streamed to a boundary scan chain. Test result data output by the scan chain is provided to a UART host via the UART.

20 Claims, 5 Drawing Sheets

CONTROLLER ACCESSIBLE TEST ACCESS PORT CONTROLS

TECHNICAL FIELD

Embodiments of the disclosure relate generally to memory sub-systems and, more specifically, to test access port (TAP) controls that are accessible to a memory sub-system controller.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
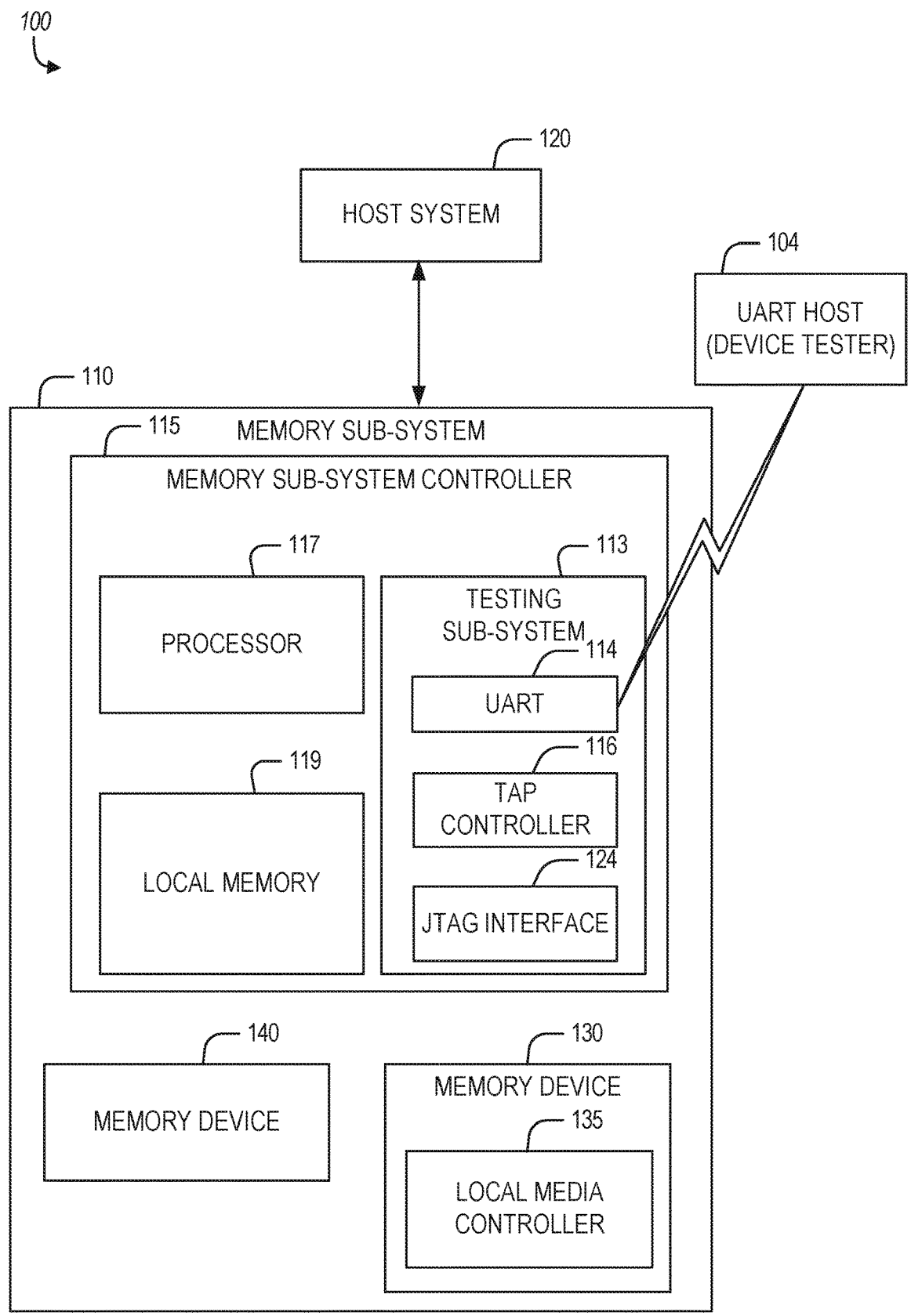
FIG. 1 illustrates an example computing system that includes a memory sub-system, in accordance with some embodiments of the present disclosure.

Aspects of the present disclosure are directed to facilitating boundary scan testing of a printed circuit board (PCB) mounted memory sub-system controller. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system controller (referred to hereinafter simply as a "controller") can receive commands or operations from the host system and can convert the commands or operations into instructions or appropriate commands to achieve the desired access to the memory components. After manufacture of a controller on a PCB, controller structure and functionality are tested and verified. Joint Test Action Group (JTAG) is an industry standard for verifying designs and testing PCBs after manufacture. JTAG specifies use of a dedicated debug port to implement a serial communications interface (also referred to herein as a "JTAG interface" or "JTAG port") that provides access to a controller without requiring direct external access to the system address and data buses. The interface connects to an on-chip test access port (TAP) controller that implements a stateful protocol to access a set of test registers. JTAG also includes a specification for a method for testing interconnections on PCBs called boundary scan testing.

Access and sampling of boundary scan testing results is typically limited to specialized testers that are only employed in In-Circuit Test (ICT). That is, in conventional implementations, test points must be placed on a PCB and driven by a specialized external ICT tester capable of driving the JTAG connection to achieve boundary scan coverage and consumption of a Boundary Scan Description Language (BSDL) file.

Aspects of the present disclosure address the above and other deficiencies of conventional controller implementations by enabling boundary scan testing using a memory device tester via a Universal Asynchronous Receiver/Transmitter (UART) connection without requiring an external boundary scan connection. A UART host (e.g., standard memory device tester) can be connected to a UART of a memory sub-system and can provide boundary scan test data to a test access port (TAP) controller via the UART along with a command to initiate boundary scan testing. The TAP controller, in turn, imitates a boundary scan testing mode using a JTAG interface and synchronously streams a boundary scan test vector based on the boundary scan test to an input of a scan chain via the JTAG interface. The TAP controller provides test result data to the UART host via the UART. The test result data is obtained from an output of the scan chain and results from providing the boundary scan test vector as input to the scan chain.

It shall be appreciated that the testing approach described above redirects the typical use case of boundary scan (IEEE 1149.x) from an externally driven operation to an internally driven operation. The benefit of this approach is that it allows for boundary scan testing of a PCB mounted system without requiring external connections. This is in contrast to classical implementations of boundary scan testing where test points must be placed on a PCB and driven by a specialized external tester capable of driving the JTAG connection to achieve the boundary scan coverage. This approach further alleviates some PCB space/routing considerations by reducing a necessary pin count for facilitating multiple modes of testing the controller. Moreover, this approach would allow testing to be performed in volume on a regular PCB ATE and would not require additional expense from the ATE hardware, contrary to typical implementations in which boundary scan is performed on a sampled basis due to the cost of the fixturing and the throughput. Indeed, the implementation described herein extends the use of a very high coverage test methodology from a capital-intensive, hardware-only solution to a solution that can be utilized in all systems.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a SSD, a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and so forth.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fiber Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) includes a NAND type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND)

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), NOR flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and the like. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 and convert responses associated with the memory devices 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system includes a testing sub-system 113 to facilitate testing of the memory sub-system controller 115. In some embodiments, the memory sub-system controller 115 includes the testing sub-system 113. The testing sub-system 113 comprises a universal asynchronous receiver-transmitter (UART) 114 and a test access point (TAP) controller 116. The UART 114 can comprise a physical circuit that is generally responsible for transmitting and receiving serial data. To this end, the UART comprises a receiver channel to receive input data and a transmitter channel to transmit output data. In the context of the present disclosure, the memory sub-system 110 is on a PCB and the receiver channel and transmitter channel are exposed on the PCB and externally accessible to a UART host 104.

The TAP controller 116 may be or comprise a state machine to control operation of the testing sub-system 113. The TAP controller 116 is connected to a JTAG interface 124 (also referred to as a "Test Access Port" or "TAP"). The JTAG interface 124 uses multiple signals in support of boundary scan testing. For example, the JTAG interface 124 may comprise: a test clock (TCK) pin to receive a clock signal that synchronizes internal state machine operations; a testing mode select (TMS) pin to receive a signal that is sampled at the rising edge of the clock signal to determine a next state; a test data in (TDI) pin to receive a signal representing data shifted into test or programming logic of the testing sub-system 113; a test data out (TDO) pin to output a signal that represents data shifted out of the test or programming logic; and a test reset pin (TRST) to reset the TAP controller 116 state machine.

The UART host 104 may be a memory device tester and can be coupled to the testing sub-system 113 via external connections to the receiver channel and the transmitter channel exposed on the PCB. The UART host 104 can work in conjunction with the testing sub-system 113 to perform testing on the controller 115 to verify the structure and proper functioning of the controller 115 using boundary scan testing methods. For example, the UART host 104 may provide the testing sub-system 113 with boundary scan data, via the receiver channel of the UART 114, along with a command to initiate boundary scan testing at the memory sub-system controller 115. Based on receiving the command, the TAP controller 116 initiates a boundary scan test mode and synchronously streams a boundary scan test vector to a scan chain via the JTAG interface 124. The boundary scan data may include the boundary scan test vector or a BSDL file from which the boundary scan test vector may be derived by the testing sub-system 113. The testing sub-system 113 obtains test result data from an output of the scan chain and provides the test result data to the UART host 104 via the transmitter channel of the UART 114. The test result data is generated as a result of providing the test vector as input to the scan chain.

The UART host 104 can compare the test result data with data representing an expected result of applying the test vector to the scan chain of the memory sub-system controller 115. The UART host 104 can classify the test result data as either a positive or negative test result based on the comparison. A positive test result occurs when test result data matches the expected result. A negative test result occurs when test result data does not match the expected result.

The testing sub-system 113 can also include additional circuitry or components to perform various command interpretation, multiplexing, and clocking operations in support of facilitating boundary scan testing via connections to the UART 114. The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

Although FIG. 1 illustrates the testing sub-system 113 residing on the memory sub-system controller 115, it shall be appreciated that in other embodiments, the testing sub-system 113 may reside on the local media controller 135. Further, in some embodiments, a testing sub-system 113 may be implemented within both the memory sub-system controller 115 and the local media controller 135.

Figure 2:
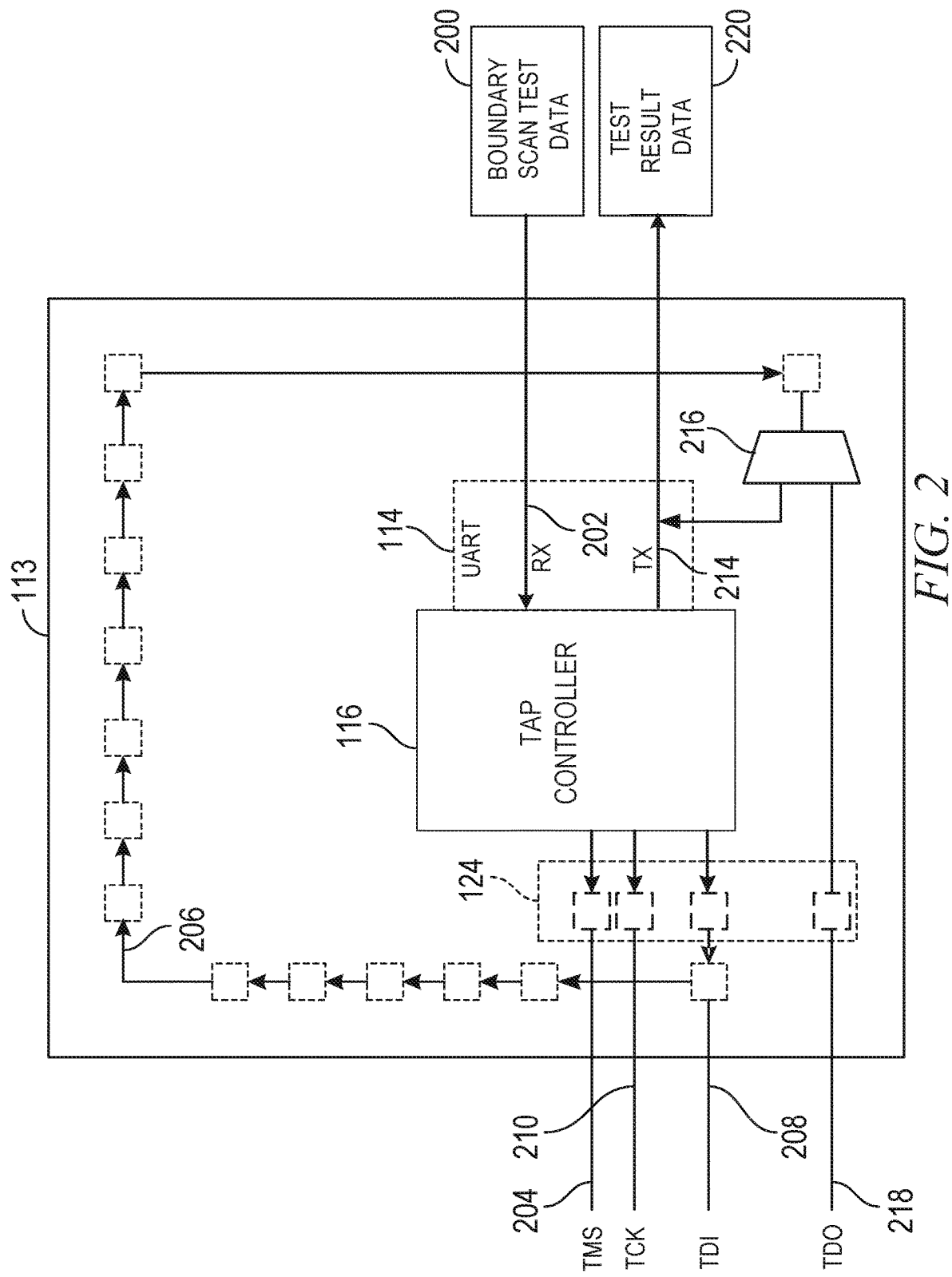
FIG. 2 illustrates a process flow for facilitating post-manufacture boundary scan testing of a printed circuit board (PCB) mounted memory sub-system controller, in accordance with some embodiments of the present disclosure.

FIG. 2 illustrates a process flow for facilitating post-manufacture boundary scan testing of a PCB mounted memory sub-system controller, in accordance with some embodiments of the present disclosure. To avoid obscuring the inventive subject matter with unnecessary detail, various components and other details that are not germane to conveying an understanding of the inventive subject matter have been omitted from FIG. 2. As such, a skilled artisan will readily recognize that various additional functional components that may be included within the context of FIG. 2 to facilitate additional functionality that are not specifically described herein.

As shown, boundary scan test data 200 is received as input on a receiver channel 202 of the UART 114. As referenced above, the boundary scan test data 200 can be provided by a device tester corresponding to UART host 104. The boundary scan test data 200 can include one or more boundary scan test vectors or one or more BSDL files from which the testing sub-system 113 can derive one or more boundary scan test vectors. A boundary scan test vector comprises a bit sequence. The boundary scan test data 200 can, in some embodiments, further include a command to initiate a boundary scan test. For example, the boundary scan test data 200 can comprise a data packet and the command may be included in a packet header while the test vectors or BSDL files are included in the packet body. In some embodiments, the command can be separately provided by the UART host 104 prior to providing the boundary scan test data 200.

Based on receiving the command, the testing sub-system 113 initiates a boundary scan test mode. The testing sub-system 113 can initiate the boundary scan test mode by asserting a TMS signal on a TMS pin 204 of the JTAG interface 124. Once the boundary scan test mode is initiated, the TAP controller 116 synchronously streams a boundary scan test vector to a scan chain 206 via a TDI pin 208 of the JTAG interface 124. The testing sub-system 113 may comprise circuitry or other components to perform various command processing, buffering, and clocking functionality to facilitate a boundary scan test. For example, although the JTAG interface 124 includes a TCK pin 210 to receive a clock signal, the TCK pin 210 may not be used in some embodiments. Instead, the testing sub-system 113 can, in some embodiments, include one or more buffers that can be used to buffer the boundary scan test vector to provide a synchronous input signal to the TDI pin 208 based on the boundary scan test data 200 that was provided asynchronously via the UART 114. Accordingly, prior to providing the synchronous input stream to the scan chain 206, the testing sub-system 113 can add one or more portions of a test vector into one or more buffers.

The scan chain 206 comprises multiple scan cells connected in a chain. Each boundary scan cell comprises a shift-register stage that is connected between an input or output pin of the memory sub-system controller 115 and application logic to which each pin is normally connected. The scan chain 206 has two states of operation. A first state allows a sequence of bits representing data and instructions to be shifted (scanned-in) into a chain of scan cells, resulting in latching each cell to the desired value. A second state of operation involves testing the application logic. The test operation involves either receiving test data (e.g., a test vector) from the application logic and then latching the output, or shifting test data into the application logic.

After the scan chain 206 is loaded with bits from the test vector, a test response is captured from an output of the scan chain 206 by the testing sub-system 113 in one or more clock cycles and test result data 220 comprising the test result is provided to the UART host 104 via a transmitter channel 214 of the UART 114. More specifically, as shown, the testing sub-system 113 comprises a dual output multiplexer 216 that multiplexes the test response output by the scan chain 206 between a TDO pin 218 of the JTAG interface 124 and the transmitter channel 214 of the UART 114. That is, a first output of the multiplexer 216 is connected to the TDO pin 218 of the JTAG interface 124 and provides test result data 220 thereto while a second output of the multiplexer 216 is connected to the transmitter channel 214 of the UART 114 and provides the test result data 220 thereto.

In some embodiments, an indication that the test result data 220 is forthcoming may be provided to the UART 114 prior to providing the test result data 220. Depending on the embodiment, the indication may be provided as part of the test result data 220 (e.g., in a packet header) or may be provided separately from the test result data 220.

Figure 3:
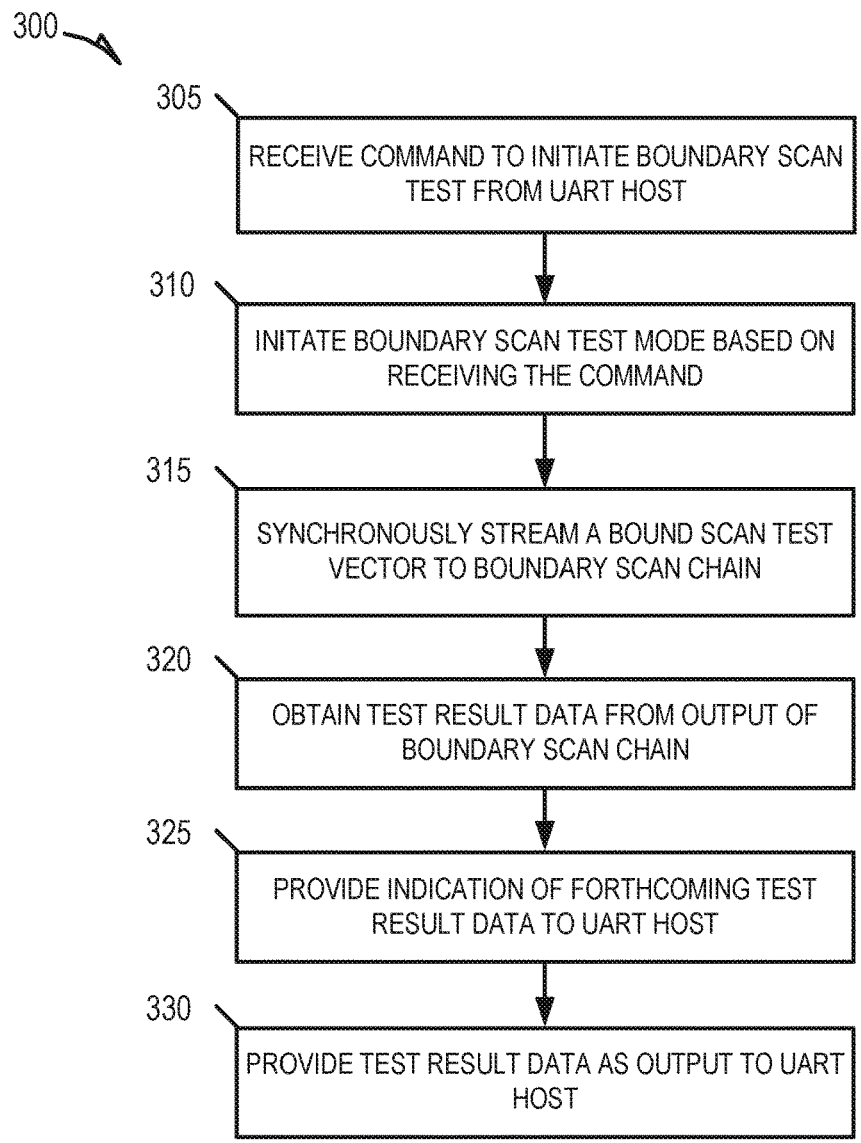
FIGS. 3 and 4 are flow diagrams of an example method to facilitate post-manufacture boundary scan testing of a PCB mounted memory sub-system controller, in accordance with some embodiments of the present disclosure
Figure 4:
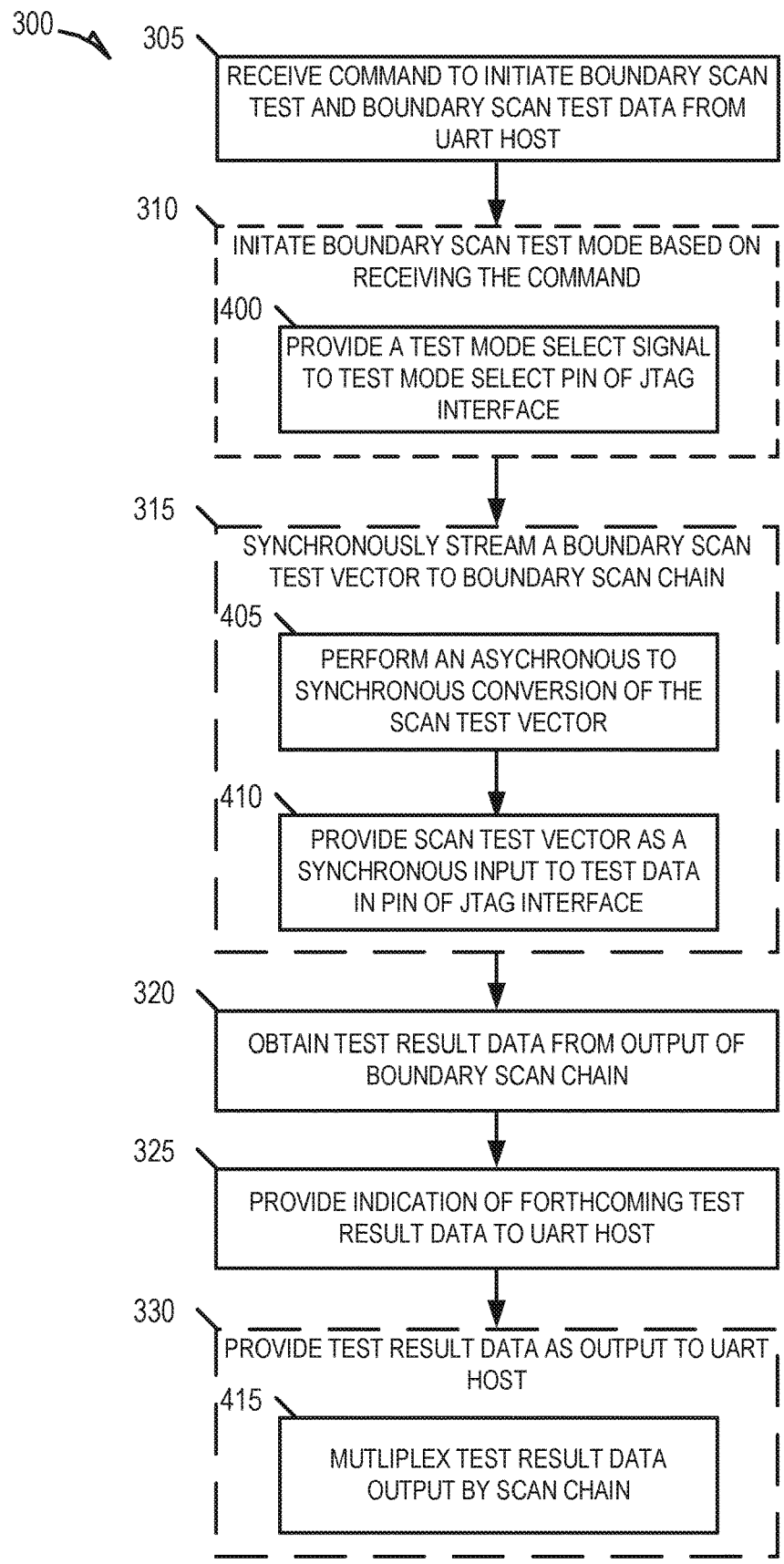

FIGS. 3 and 4 are flow diagrams of an example method 300 to facilitate post-manufacture boundary scan testing of the memory sub-system controller 115, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the testing sub-system 113. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device receives boundary scan test data and a command to initiate a boundary scan test from a UART host (e.g., UART host 104). That is, the UART host may provide the boundary scan test data and the command as input to the receiver line of the UART. The command and boundary scan test may be received as an asynchronous packet from the UART host via a UART (e.g., UART 114) where, for example, the command is included in a packet header. Depending on the embodiment, the boundary scan test data may include one or more boundary scan test vectors or one or more BSDL files.

The processing device initiates a boundary scan mode at operation 310 based on receiving the command and synchronously streams a boundary scan test vector to a scan chain (e.g., scan chain 206), at operation 315. The processing device may perform various buffering, multiplexing, and clocking operations to synchronously provide the boundary scan test vector to the scan chain. In embodiments in which the boundary scan test data includes a BSDL file, the processing device may convert the BSDL file to the boundary scan test vector.

The scan chain outputs test result data as a result of the boundary scan test vector being input into the scan chain, and the processing device obtains the test result data output by the scan chain at operation 320.

At operation 325, the processing device provides, via the UART an indication of forthcoming test result data to the UART host. The processing device provides the test result data to the UART host via the UART at operation 330. That is, the processing device causes the test result data to be output on the transmitter line of the UART, which is connected to the UART host. In some embodiments, the indication of forthcoming test result data and the test result data may be provided to the UART host as a single data packet where, for example, the indication is included in a packet header.

As shown in FIG. 4, the method 300 may, in some embodiments, include operations 400, 405, 410, and 415. Consistent with these embodiments, the operation 400 may be performed as part of (e.g., a sub-operation) operation 310 wherein the processing device initiates a boundary scan test mode. At operation 400, the processing device provides a test mode select signal to the TMS pin of a JTAG interface (e.g., JTAG interface 124). The test mode select signal is based on the boundary scan test data.

Consistent with these embodiments, the operations 405 and 410 may be performed as part of (e.g., sub-operations) of operation 315 where the processing device synchronously streams the scan test vector to the scan chain. At operation 405, the processing device performs an asynchronous to synchronous conversion of the scan test vector, and at operation 410, the processing device provides the scan test vector as a synchronous input to a TDI pin of the JTAG interface. The asynchronous-to-synchronous conversion of the scan test vector may comprise buffering the boundary scan test vector. That is, the processing device may add a portion of the boundary scan test vector (e.g., a byte) to a buffer at each clock cycle and provide the buffered portion of the boundary scan test vector as input to the TDI pin of the JTAG interface during the next clock cycle, thereby creating a clocked input signal to the TDI pin.

Consistent with these embodiments, the operation 415 may be performed as part of the operation 330 (e.g., a sub-operation) where the processing device provides the test result data as output to the UART host. At operation 415, the processing device multiplexes the test result data output by the scan chain. That is, the processing device multiplexes the test result data output by the scan chain such that the test result data is provided as output to the transmit channel of the UART. For example, the processing device may utilize a multiplexer with a single input and a dual output. In this example, the input is connected to the output of the scan chain and receives the test result data, a first output is connected to the TDO pin of the JTAG interface, and the second output is connected to the transmit channel of the UART. The processing device may control the multiplexer such that the test result data provided at the multiplexer input is output to the transmit channel through the second multiplexer output.

EXAMPLES

Example 1 is a memory sub-system controller comprising: an universal asynchronous receiver-transmitter (UART), the UART to receive, from a UART host, a command to initiate a boundary scan test and boundary scan test data; and a processing device coupled to the UART, processing device to perform operations comprising: based on receiving the command, initiating a boundary scan test mode; and synchronously streaming, to a scan chain, a boundary scan test vector based on the boundary scan test data received at a receiver of the UART; and wherein the UART is further to provide test result data output by the scan chain to the UART host, the test result data resulting from synchronously streaming the boundary scan test vector to the scan chain.

Example 2 comprises the subject matter of Example 1, wherein the synchronous streaming of the boundary scan test vector to the scan chain optionally comprises performing an asynchronous-to-synchronous conversion of the boundary scan test vector.

Example 3 comprises the subject matter of any one of Examples 1 and 2, wherein the synchronous streaming of the boundary scan test vector to the scan chain optionally comprises buffering the boundary scan test vector.

Example 4 comprises the subject matter of any one of Examples 1-3, wherein the synchronous streaming of the boundary scan test vector to the scan chain optionally comprises adding a portion of the boundary scan test vector to a buffer during a first clock cycle and providing the portion of the boundary scan test vector to the scan chain during a second clock cycle.

In Example 5, the subject matter of any one of Examples 1-4 optionally further comprises: providing a test mode select signal to a test mode select (TMS) pin of a JTAG interface coupled to the scan chain to initiate the boundary scan test mode.

In Example 6, the subject matter of any one of Examples 1-5 optionally, further comprises: providing the scan test vector as input to a test data in (TDI) pin of the JTAG interface.

Example 7 comprises the subject matter of any one of Examples 1-6 wherein: the boundary scan test data optionally comprises a Boundary Scan Descriptive Language (BSDL) file, and the processing generates the boundary scan test vector based on the BSDL file.

Example 8 comprises the subject matter of any one of Examples 1-7 wherein: the boundary scan test data optionally comprises the boundary scan test vector.

Example 9 comprises the subject matter of any one of Examples 1-8 and optionally further comprises a multiplexer having a multiplexer input, a first multiplexer output and a second multiplexer output, wherein the multiplexer input is connected to an output of the scan chain, the first multiplexer output is connected to a test data out (TDO) pin of the JTAG interface, and the second multiplexer output is connected to the UART, wherein the second multiplexer output provides the test result data to the UART.

Example 10 comprises the subject matter of any one of Examples 1-9, wherein the UART optionally provides, to the UART host, an indication of forthcoming test result data prior to providing the test result data to the UART host.

Example 11 is a method comprising: receiving, via a universal asynchronous receiver-transmitter (UART), boundary scan test data and a command to initiate a boundary scan test from a UART host; and based on receiving the command, initiating a boundary scan test mode at a memory sub-system controller; synchronously streaming, via a Joint Test Action Group (HAG) interface, a boundary scan test vector to a scan chain based on the boundary scan test data received at a receiver of the UART; and providing, via the UART, test result data output by the scan chain to the UART host, the test result data resulting from synchronously streaming the boundary scan test vector to the scan chain.

Example 12 comprises the subject matter of Example 11, wherein the synchronous streaming of the boundary scan test vector to the scan chain optionally comprises performing an asynchronous-to-synchronous conversion of the boundary scan test vector.

Example 13 comprises the subject matter of any one of Examples 11 or 12, wherein the synchronous streaming of the boundary scan test vector to the scan chain optionally comprises buffering the boundary scan test vector.

Example 14 comprises the subject matter of any one of Examples 11-13, wherein the synchronous streaming of the boundary scan test vector to the scan chain optionally comprises adding a portion of the boundary scan test vector to a buffer during a first clock cycle and providing the portion of the boundary scan test vector to the scan chain during a second clock cycle.

In Example 15, the subject matter of any one of Examples 11-14 optionally further comprises: providing a test mode select signal to a test mode select (TMS) pin of a JTAG interface coupled to the scan chain to initiate the boundary scan test mode.

In Example 16, the subject matter of any one of Examples 11-15 optionally further comprises: providing the scan test vector as input to a test data in (TDI) pin of the JTAG interface.

Example 17 comprises the subject matter of any one of Examples 11-16 wherein: the boundary scan test data optionally comprises a Boundary Scan Descriptive Language (BSDL) file, and the processing generates the boundary scan test vector based on the BSDL file.

Example 18 comprises the subject matter of any one of Examples 11-17 wherein: the boundary scan test data optionally comprises the boundary scan test vector.

Example 19 comprises the subject matter of any one of Examples 11-19, wherein the UART optionally provides, to the UART host, an indication of forthcoming test result data prior to providing the test result data to the UART host.

Example 20 is a system comprising: A non-transitory computer-readable storage medium comprising instructions that, when executed by a processing device, configure the processing device to perform operations comprising: receiving, via a universal asynchronous receiver-transmitter (UART), boundary scan test data and a command to initiate a boundary scan test from a UART host; and based on receiving the command, initiating a boundary scan test mode at a memory sub-system controller; synchronously streaming, via a Joint Test Action Group (JTAG) interface, a boundary scan test vector to a scan chain based on the boundary scan test data received at a receiver of the UART; and providing, via the UART, test result data output by the scan chain to the UART host, the test result data resulting from synchronously streaming the boundary scan test vector to the scan chain.

Figure 5:
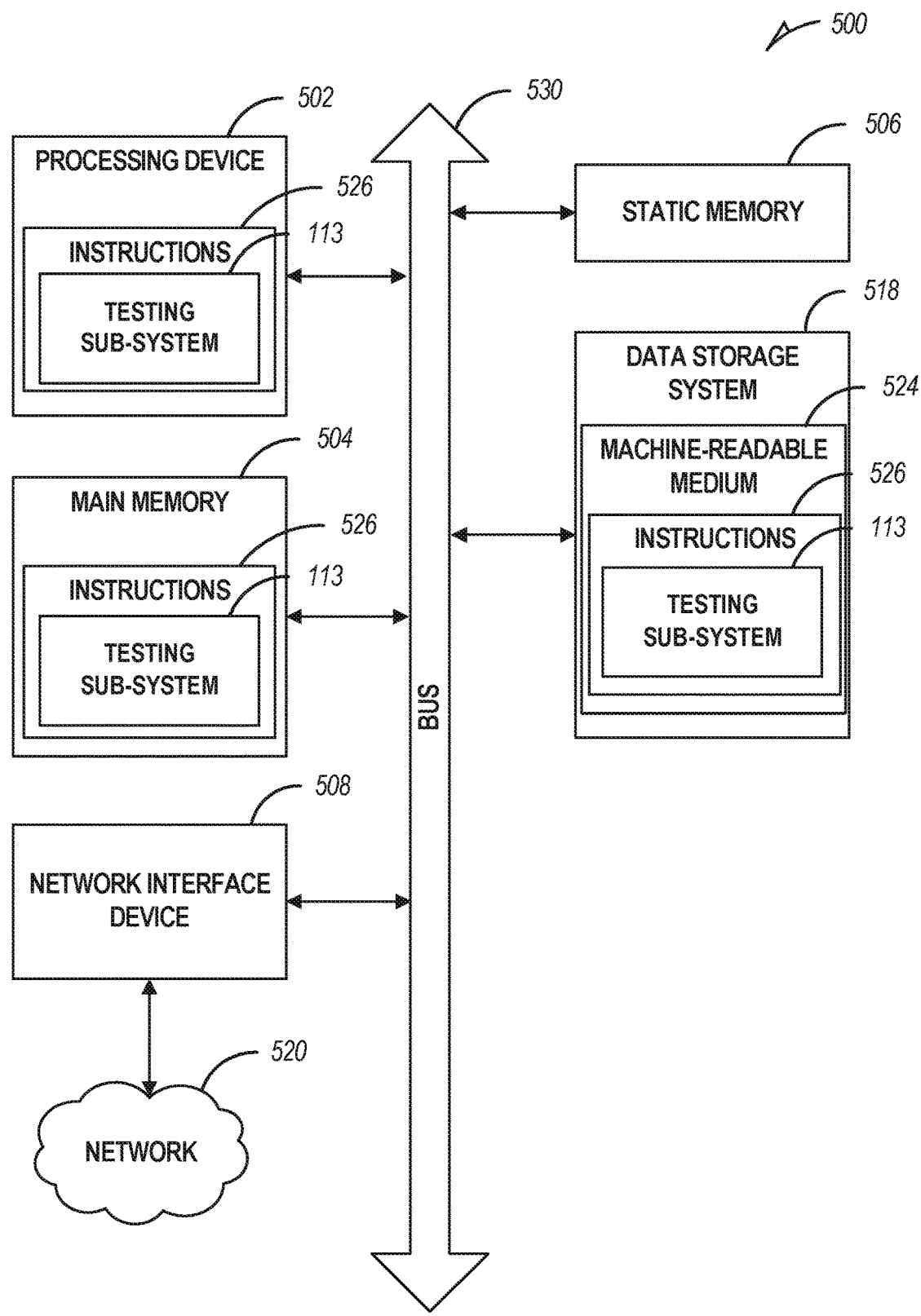
FIG. 5 is a block diagram of an example computer system in which embodiments of the present disclosure may operate.

FIG. 5 illustrates an example machine in the form of a computer system 500 within which a set of instructions can be executed for causing the machine to perform any one or more of the methodologies discussed herein. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the testing sub-system 113 of FIG. 1). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly, execute a set (or multiple sets) of instructions to perform any one or more of the methodologies discussed herein.

The example computer system 500 includes a processing device 502, a main memory 504 (e.g., ROM, flash memory, DRAM such as SDRAM or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device 502 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 502 can also be one or more special-purpose processing devices such as an ASIC, an FPGA, a digital signal processor (DSP), a network processor, or the like. The processing device 502 is configured to execute instructions 526 for performing the operations and steps discussed herein. The computer system 500 can further include a network interface device 508 to communicate over a network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a security component (e.g., the testing sub-system 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; ROMs; RAMs; erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., a computer-readable) storage medium such as a ROM, a RAM, magnetic disk storage media, optical storage media, flash memory components, and so forth.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

What is claimed is:

1. A memory sub-system controller comprising:
   a universal asynchronous receiver-transmitter (UART), the UART to receive, from a UART host, a command to initiate a boundary scan test and boundary scan test data;
   a processing device coupled to the UART, the processing device to perform operations comprising:
      based on receiving the command, initiating a boundary scan test mode; and
      synchronously streaming, to a scan chain comprising a plurality of scan cells, a boundary scan test vector based on the boundary scan test data received at the UART,
   a multiplexer having an multiplexer input, a first multiplexer output and a second multiplexer output, the multiplexer input being connected to an output of the scan chain, the first multiplexer output being connected to a test data out (TDO) element of a JTAG interface, the second multiplexer output being connected to the UART, the second multiplexer output providing test result data to the UART, the test result data resulting from synchronously streaming the boundary scan test vector to the scan chain, the UART providing the test result data to the UART host.

2. The memory sub-system controller of claim 1, wherein the synchronous streaming of the boundary scan test vector to the scan chain comprises performing an asynchronous-to-synchronous conversion of the boundary scan test vector.

3. The memory sub-system controller of claim 2, wherein performing the asynchronous-to-synchronous conversion of the boundary scan test vector comprises buffering the boundary scan test vector.

4. The memory sub-system controller of claim 3, wherein the memory sub-system controller comprises a buffer, wherein the buffering of the boundary scan test vector comprising adding a portion of the boundary scan test vector to the buffer during a first clock cycle and providing the portion of the boundary scan test vector to the scan chain during a second clock cycle.

5. The memory sub-system controller of claim 1, wherein the initiating of the boundary scan test mode comprises:
   providing a test mode select signal to a test mode select (TMS) pin of a Joint Test Action Group (JTAG) interface coupled to the scan chain.

6. The memory sub-system controller of claim 5, wherein streaming the boundary scan test vector to a scan chain comprises:
   providing the scan test vector as input to a test data in (TDI) pin of the JTAG interface.

7. The memory sub-system controller of claim 1, wherein:
   the boundary scan test data comprises a Boundary Scan Descriptive Language (BSDL) file; and
   the processing device generates the boundary scan test vector based on the BSDL file.

8. The memory sub-system controller of claim 7, wherein:
   the boundary scan test data comprises the boundary scan test vector generated based on a BSDL file.

9. The memory sub-system controller of claim 1, wherein the processing device causes the multiplexer to output the test result data at the second multiplexer output to a transmit channel of the UART.

10. The memory sub-system controller of claim 1, wherein the UART provides, to the UART host, an indication of forthcoming test result data prior to providing the test result data to the UART host.

11. A method comprising:
receiving, via a universal asynchronous receiver-transmitter (UART), boundary scan test data and a command to initiate a boundary scan test from a UART host;
based on receiving the command, initiating a boundary scan test mode at a memory sub-system controller;
synchronously streaming, via a Joint Test Action Group (JTAG) interface, a boundary scan test vector to a scan chain based on the boundary scan test data received at a receiver of the UART;
multiplexing, by a multiplexer, test result data output by the scan chain, the test result data being multiplexed such that the test result data is provided to a transmit channel of the UART, the test result data resulting from synchronously streaming the boundary scan test vector to the scan chain; and
providing, via the UART, the test result data output by the scan chain to the UART host.

12. The method of claim 11, wherein the synchronous streaming of the boundary scan test vector to the scan chain comprises performing an asynchronous-to-synchronous conversion of the boundary scan test vector.

13. The method of claim 12, wherein performing the asynchronous-to-synchronous conversion of the boundary scan test vector comprises buffering the boundary scan test vector.

14. The method of claim 13, wherein the buffering of the boundary scan test vector comprises adding a portion of the boundary scan test vector to a buffer during a first clock cycle and providing the portion of the boundary scan test vector to the scan chain during a second clock cycle.

15. The method of claim 11, wherein the initiating of the boundary scan test mode comprises:
providing a test mode select signal to a test mode select (TMS) pin of a the JTAG interface coupled to the scan chain.

16. The method of claim 15, wherein streaming the boundary scan test vector comprises:
providing the scan test vector as input to a test data in (TDI) pin of the JTAG interface.

17. The method of claim 11, further comprising generating the boundary scan test vector based on a BSDL file included in the boundary scan test data.

18. The method of claim 11, wherein:
the boundary scan test data comprises the boundary scan test vector.

19. The method of claim 11, further comprising providing, to the UART host, an indication of forthcoming test result data prior to providing the test result data to the UART host.

20. A non-transitory computer-readable storage medium comprising instructions that, when executed by a processing device, configure the processing device to perform operations comprising:
receiving, via a universal asynchronous receiver-transmitter (UART), boundary scan test data and a command to initiate a boundary scan test from a UART host;
initiating a boundary scan test mode at a memory sub-system controller based on receiving the command;
synchronously providing, via a Joint Test Action Group (JTAG) interface, a boundary scan test vector to a scan chain based on the boundary scan test data received at a receiver of the UART, and
multiplexing test result data output by the scan chain, the test result data being multiplexed such that the test result data is provided to a transmit channel of the UART, the test result data resulting from synchronously streaming the boundary scan test vector to the scan chain; and
providing, via the UART, the test result data output by the scan chain to the UART host.

\* \* \* \* \*